United States Patent
Yang

(10) Patent No.: US 9,905,633 B1
(45) Date of Patent: Feb. 27, 2018

(54) STRUCTURE AND FORMATION METHOD OF SEMICONDUCTOR DEVICE STRUCTURE

(71) Applicant: Taiwan Semiconductor Manufacturing Co., Ltd., Hsinchu (TW)

(72) Inventor: Chi-Han Yang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/402,670

(22) Filed: Jan. 10, 2017

Related U.S. Application Data

(60) Provisional application No. 62/427,040, filed on Nov. 28, 2016.

(51) Int. Cl.

| | |
|---|---|
| *H01L 29/00* | (2006.01) |
| *H01L 49/02* | (2006.01) |
| *H01L 21/768* | (2006.01) |
| *H01L 23/528* | (2006.01) |
| *H01L 23/522* | (2006.01) |

(52) U.S. Cl.
CPC ........ *H01L 28/24* (2013.01); *H01L 21/76816* (2013.01); *H01L 21/76877* (2013.01); *H01L 23/528* (2013.01); *H01L 23/5226* (2013.01)

(58) Field of Classification Search
USPC ... 257/E21.575–E21.597, E21.627, E21.641, 257/E27.175, E27.017, E27.03–E27.032, 257/E27.109, E29.194–E29.225, 257/E21.382–E21.385, E21.695–E21.696, 257/E21.372, E21.38–E21.381, 257/E21.608–E21.613, E21.369–E21.393, 257/288, 401, 901, 154, 350, 358–359, 257/363, 379, 381, 516, 533, 536, 257/571–572, 577, 580–582, 904, 257/E21.001–E21.007, 537; 438/202–208, 234–239, 170, 189, 438/292–378

See application file for complete search history.

(56) References Cited

U.S. PATENT DOCUMENTS

| | | | | |
|---|---|---|---|---|
| 2009/0302993 | A1* | 12/2009 | Fujiwara | ............. H01L 23/5228 338/314 |
| 2015/0348908 | A1* | 12/2015 | Nagakura | ............. H01L 21/768 257/533 |

* cited by examiner

*Primary Examiner* — Tram H Nguyen
(74) *Attorney, Agent, or Firm* — Birch, Stewart, Kolasch & Birch, LLP

(57) ABSTRACT

Structures and formation methods of a semiconductor device structure are provided. A method for forming a semiconductor device structure includes forming a first patterned conductive layer. The method also includes forming a dielectric layer covering the first conductive layer. The method further includes forming a conductive via in the dielectric layer. In addition, the method includes forming a resistor layer and a protection layer over the dielectric layer. The method also includes patterning the protection layer to form a protection feature and patterning the resistor layer to form a resistor feature overlapping the first conductive layer. The resistor feature is electrically connected to the first conductive layer through the conductive via. The method further includes forming a second conductive layer over the dielectric layer. The top surface of the resistor feature maintains covered by the protection feature during the formation of the second conductive layer.

20 Claims, 12 Drawing Sheets

STRUCTURE AND FORMATION METHOD OF SEMICONDUCTOR DEVICE STRUCTURE

CROSS REFERENCE TO RELATED APPLICATIONS

This Application claims the benefit of U.S. Provisional Application No. 62/427,040, filed on Nov. 28, 2016, and entitled "Structure and formation method of semiconductor device structure", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
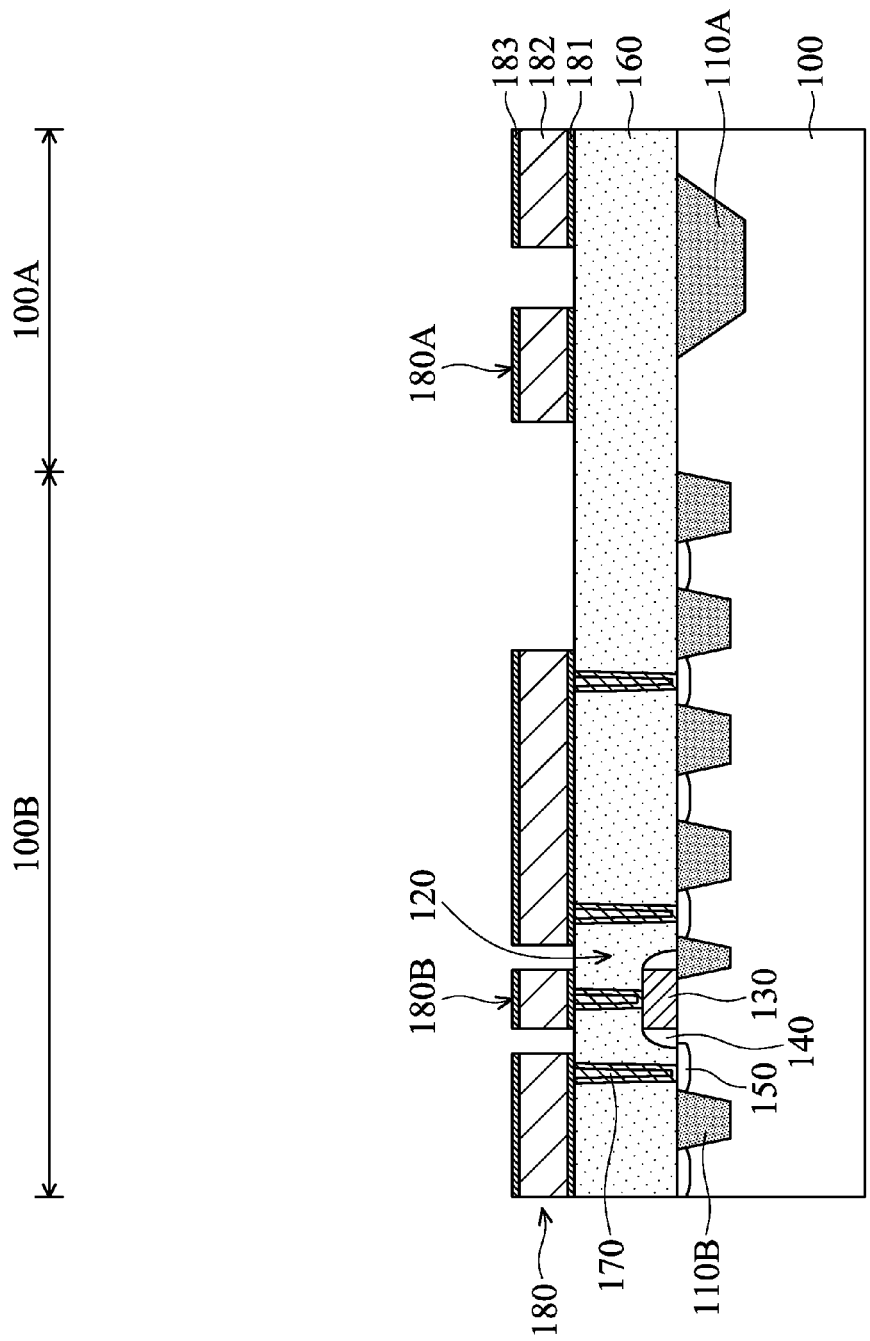
FIGS. 1A-1J are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1J are cross-sectional views of various stages of a process for forming a semiconductor device structure, in accordance with some embodiments. FIG. 2 is a top view of one stage of a process for forming a semiconductor device structure, in accordance with some embodiments. Additional operations can be provided before, during, and/or after the stages described in FIGS. 1A-1J and FIG. 2. Some of the stages that are described can be replaced or eliminated for different embodiments. Additional features can be added to the semiconductor device structure. Some of the features described below can be replaced or eliminated for different embodiments.

Figure 2:
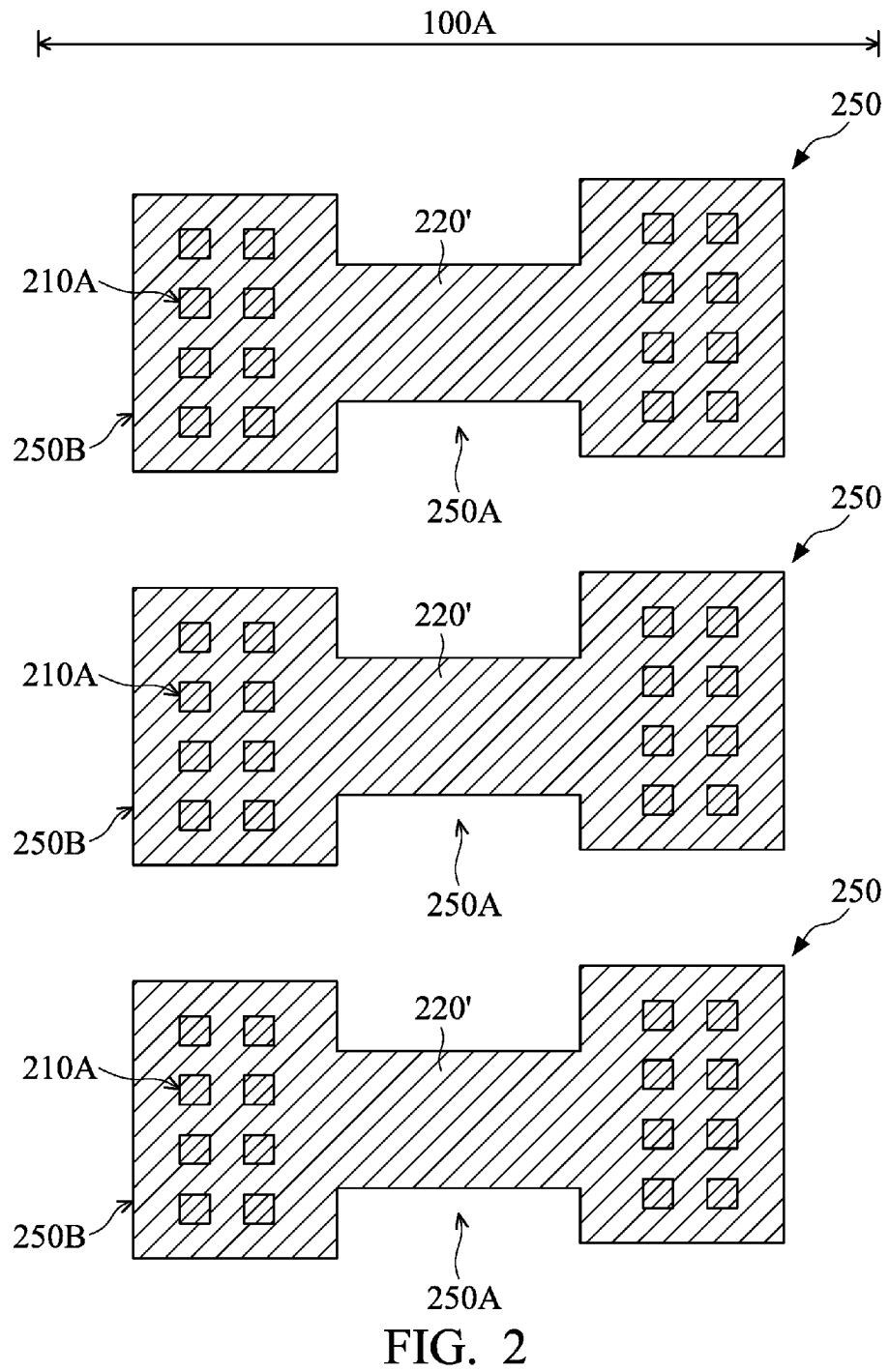
FIG. 2 is a top view of one stage of a process for forming a semiconductor device structure, in accordance with some embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

As shown in FIG. 1A, the semiconductor substrate 100 has a resistor region 100A and a non-resistor region 100B, in accordance with some embodiments. Multiple resistors will be formed in the resistor region 100A. The resistors may be thin-film-resistors (TFRs) or other suitable resistors. In some embodiments, the non-resistor region 100B includes a logic region, an active region, another suitable passive region, or a combination thereof. Various logic circuits, device elements, and/or other suitable passive elements may be formed in the non-resistor region 100B.

As shown in FIG. 1A, isolation features including isolation features 110A and 110B are formed in the semiconductor substrate 100, in accordance with some embodiments. In some embodiments, the isolation feature 110A is in the resistor region 100A and the isolation features 110B are in the non-resistor region 100B. The isolation features 110A and 110B are used to define different regions, such as active regions, and electrically isolate the elements formed in and/or over the semiconductor substrate 100 in different regions. In some embodiments, the isolation features 110A and 110B include shallow trench isolation (STI) features, local oxidation of silicon (LOCOS) features, other suitable isolation features, or a combination thereof.

In some embodiments, the semiconductor substrate 100 includes multiple N-type and/or P-type well regions in the resistor region 100A and the non-resistor region 100B. The N-type and/or P-type well regions may be between the isolation features 110A and 110B. The N-type and/or P-type well regions may be high-voltage well regions. In some embodiments, the semiconductor substrate 100 includes an N-type or P-type buried layer below the N-type and/or P-type well regions in the non-resistor region 100B.

As shown in FIG. 1A, various device elements including a device element 120 are formed in and/or over the semiconductor substrate 100 in the non-resistor region 100B, in accordance with some embodiments. Examples of the various device elements include transistors, diodes, another suitable element, or a combination thereof. For example, the transistors may be metal oxide semiconductor field effect transistors (MOSFET), complementary metal oxide semiconductor (CMOS) transistors, bipolar junction transistors (BJT), high voltage transistors, high-frequency transistors, p-channel and/or n channel field effect transistors (PFETs/NFETs), etc. Various processes are performed on form the various device elements, such as deposition, etching, implantation, photolithography, annealing, planarization, another applicable process, or a combination thereof.

In some embodiments, the device element 120 includes a gate structure 130, spacer structures 140 and source or drain structures 150 in the non-resistor region 100B. The gate structure 130 is over the semiconductor substrate 100. The gate structure 130 includes a gate stack (not shown). The gate stack includes one or more gate dielectric layers and one or more gate electrode layers. The spacer structures 140 are over the semiconductor substrate 100 and cover the sidewalls of the gate structure 130. The source or drain structures 150 are in and/or the semiconductor substrate 100. The source or drain structures 150 include an N-type or P-type semiconductor material.

In some embodiments, an interconnection structure is subsequently formed on the device element 120 and the semiconductor substrate 100 in the resistor region 100A and the non-resistor region 100B. The interconnection structure includes an interlayer dielectric layer (ILD), inter-metal dielectric (IMD) layers, and multiple conductive features in the ILD layer and IMD layers. The conductive features may include conductive contacts, conductive lines and/or conductive vias.

As shown in FIG. 1A, a dielectric layer 160 is deposited over the semiconductor substrate 100 in the resistor region 100A and the non-resistor region 100B, in accordance with some embodiments. The dielectric layer 160 may serve as an ILD layer of an interconnection structure. In some embodiments, the dielectric layer 160 includes multiple dielectric sub-layers.

In some embodiments, the dielectric layer 160 is made of silicon oxide, silicon oxynitride, borosilicate glass (BSG), phosphoric silicate glass (PSG), borophosphosilicate glass (BPSG), fluorinated silicate glass (FSG), low-K material, porous dielectric material, another suitable dielectric material, or a combination thereof. The material of the dielectric layer 160 is selected to minimize size, propagation delays, and crosstalk between nearby conductive features. In some embodiments, the dielectric layer 160 is deposited using a chemical vapor deposition (CVD) process, a spin-on process, a spray coating process, an atomic layer deposition (ALD) process, a physical vapor deposition (PVD) process, another applicable process, or a combination thereof.

As shown in FIG. 1A, conductive contacts 170 are formed in the dielectric layer 160 in the non-resistor region 100B, in accordance with some embodiments. In some embodiments, there is no conductive contact in the resistor region 100A.

The conductive contacts 170 are electrically connected to the device element 120. In some embodiments, one of the conductive contacts 170 is physically connected to the gate structure 130. In some embodiments, one of the conductive contacts 170 is physically connected to one of the source or drain structures 150.

In some embodiments, each of the conductive contacts 170 includes multiple conductive sub-layers. In some embodiments, the conductive contacts 170 are made of tungsten, aluminum, copper, gold, platinum, titanium, another suitable material, or a combination thereof. In some embodiments, the conductive material of the conductive contacts 170 is deposited using a PVD process, a CVD process, an electroplating process, an electroless plating process, another applicable process, or a combination thereof.

As shown in FIG. 1A, a patterned conductive layer 180 is formed over the dielectric layer 160 in the resistor region 100A and the non-resistor region 100B, in accordance with some embodiments. The conductive layer 180 is electrically connected to the conductive contacts 170.

In some embodiments, the conductive layer 180 includes multiple conductive sub-layers. For example, the conductive layer 180 has a first sub-layer 181, a second sub-layer 182 and a third sub-layer 183, as shown in FIG. 1A. The second sub-layer 182 is vertically sandwiched between the first sub-layer 181 and the third sub-layer 183. The second sub-layer 182 is thicker than the first sub-layer 181 and the third sub-layer 123.

In some embodiments, the first sub-layer 181 is made of titanium nitride, another suitable material, or a combination thereof. In some embodiments, the second sub-layer 182 is made of aluminum, copper, tungsten, titanium, nickel, gold, platinum, silver, another suitable material, or a combination thereof. In some embodiments, the third sub-layer 183 is made of titanium nitride, another suitable material, or a combination thereof. In some embodiments, the first sub-layer 181, the second sub-layer 182 or the third sub-layer 183 is deposited using a PVD process, a CVD process, an electroplating process, an electroless plating process, another applicable process, or a combination thereof.

Embodiments of the disclosure are not limited. In some embodiments, the conductive layer 180 is a single layer. The single layer is made of aluminum, copper, tungsten, titanium, nickel, gold, platinum, silver, another suitable material, or a combination thereof.

As shown in FIG. 1A, the conductive layer 180 has a portion 180A in the resistor region 100A and a portion 180B in the non-resistor region 100B, in accordance with some embodiments. In some embodiments, each of the portion 180A and the portion 180B is a conductive line or another suitable conductive feature. In some embodiments, the portion 180A vertically overlaps the isolation feature 110A. In some embodiments, the portion 180B vertically overlaps the isolation features 110B. In some embodiments, the portion 180B vertically overlaps the device element 120.

Figure 1B:
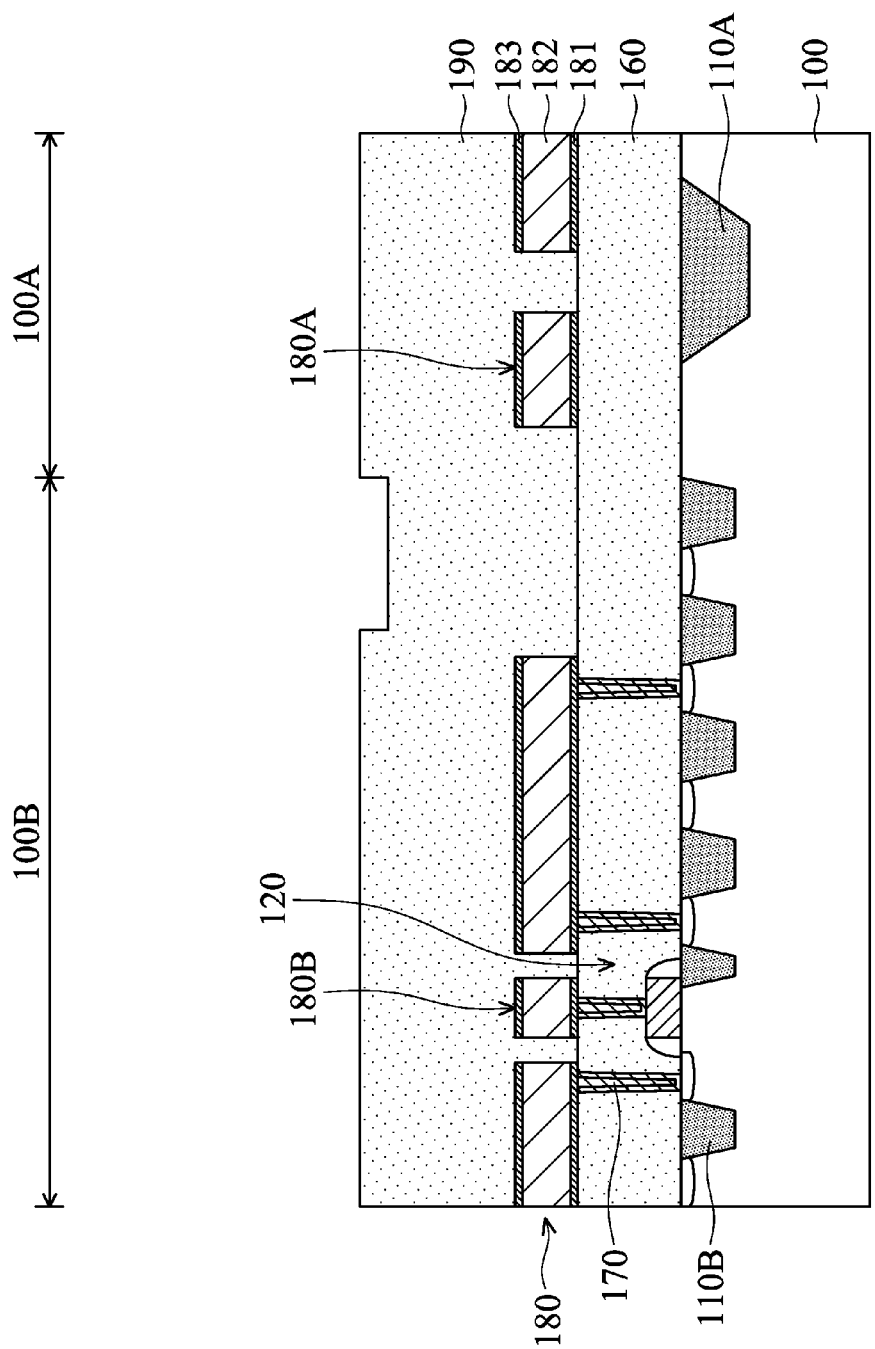

As shown in FIG. 1B, a dielectric layer 190 is deposited over the dielectric layer 160 in the resistor region 100A and the non-resistor region 100B, in accordance with some embodiments. The dielectric layer 190 covers the conductive layer 180. The dielectric layer 190 may serve as an IMD layer of an interconnection structure.

In some embodiments, the dielectric layer 190 is made of a low-k dielectric material. In some embodiments, the dielectric layer 190 includes a spin-on inorganic dielectric, a spin-on organic dielectric, a porous dielectric material, an organic polymer, an organic silica glass, SiOF serious material, a hydrogen silsesquioxane (HSQ) series material, a methyl silsesquioxane (MSQ) series material, a porous organic series material, another suitable material, or a combination thereof. In some embodiments, the dielectric layer 190 includes a material including Si, C, O, or H. For example, the dielectric layer 190 includes $SiO_2$, SiOC, SiON, SiCOH, SiOCN, or a combination thereof. In some embodiments, the dielectric layer 190 is made of carbon-doped silicon oxide. The carbon-doped silicon oxide may also be referred to as organosilicate glass (OSG) or C-oxide. In some embodiments, the carbon-doped silicon oxide includes MSQ, HSQ, polysilsesquioxane, another suitable material, or a combination thereof. In some embodiments, the dielectric layer 190 includes fluorine-doped silicate glass (FSG) such as fluorine-doped $—(O—Si(CH_3)_2—O)—$. In some embodiments, the dielectric layer 190 is deposited using a CVD process, a spin-on process, a spray coating process, another applicable process, or a combination thereof.

Afterwards, a planarization process is performed on the dielectric layer 190, in accordance with some embodiments. In some embodiments, the planarization process includes a chemical mechanical polishing (CMP) process, a mechanical grinding process, an etching process, another applicable process, or a combination thereof. For example, a CMP process and an etching back process are sequentially performed on the dielectric layer 190. As a result, the dielectric layer 190 has a substantial flat top surface, as shown in FIG. 1C.

In some embodiments, the pattern of the conductive layer 180 is fine-tuned so that the dielectric layer 190 has a substantially consistent and uniform thickness. The pattern of the conductive layer 180 may include the portion 180B of the conductive layer 180.

Figure 1C:
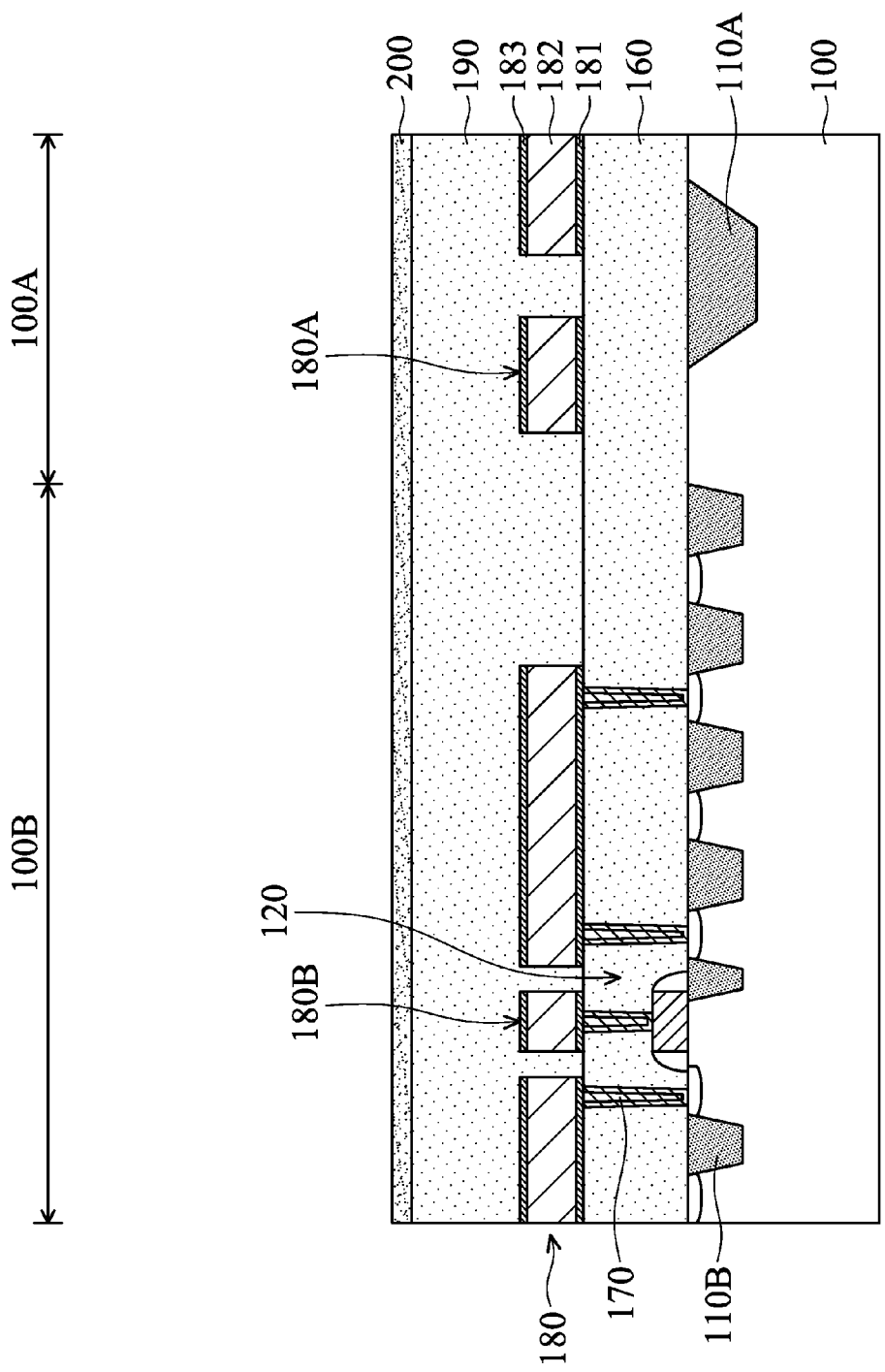

As shown in FIG. 1C, a buffer layer 200 is deposited over the dielectric layer 190 in the resistor region 100A and the non-resistor region 100B, in accordance with some embodiments. As a result, the dielectric layer 190 is capped with a high quality, low impurity buffer layer 200. The buffer layer 200 also provides good planarity over the dielectric layer 190.

In some embodiments, the buffer layer 200 is made of silicon-containing oxide, another suitable material, or a combination thereof. The silicon-containing oxide may be a silicon-rich oxide, a silane-based ($SiH_4$-based) oxide, another suitable material, or a combination thereof. In some embodiments, the buffer layer 200 is deposited using a CVD process, a plasma enhanced CVD (PECVD) process, another applicable process, or a combination thereof.

Figure 1D:
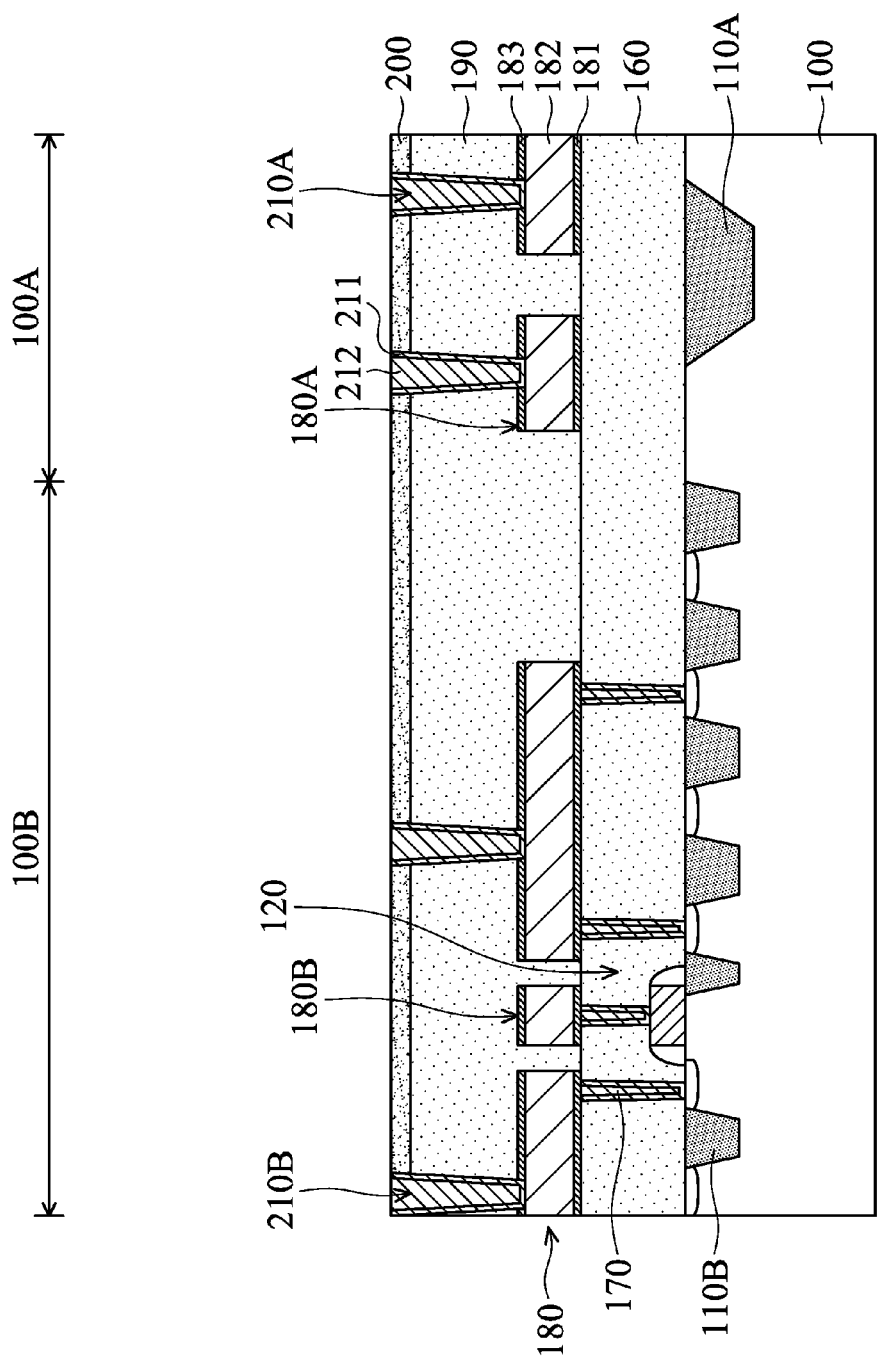

As shown in FIG. 1D, conductive vias 210A and 210B are formed in the resistor region 100A and the non-resistor region 100B, respectively, in accordance with some embodiments. The conductive vias 210A and 210B are in the dielectric layer 190 and penetrate the buffer layer 200. The conductive vias 210A are electrically connected to the portion 180A of the conductive layer 180. The conductive vias 210B are electrically connected to the portion 180B of the conductive layer 180. In some embodiments, the conductive vias 210A and 210B are positioned at substantially the same level. In some embodiments, the conductive vias 210A and 210B have a substantial same thickness or height, as shown in FIG. 1D.

In some embodiments, the conductive vias 210A and 210B include multiple sub-layers. For example, each of the conductive vias 210A and 210B has a first sub-layer 211 and a second sub-layer 212, as shown in FIG. 1D. In some embodiments, via holes are formed in the dielectric layer 190 and the buffer layer 200. As a result, the via holes expose portions of the conductive layer 180, such as the second sub-layer 182 and the third sub-layer 183. Subsequently, the first sub-layer 211 is conformally formed on the sidewalls and the bottom of the via holes. The first sub-layer 211 is connected to the second sub-layer 182 and the third sub-layer 183. Afterwards, the second sub-layer 212 fills up the via holes in the dielectric layer 190 and the buffer layer 200 so as to form the conductive vias 210A and 210B.

Figure 1E:
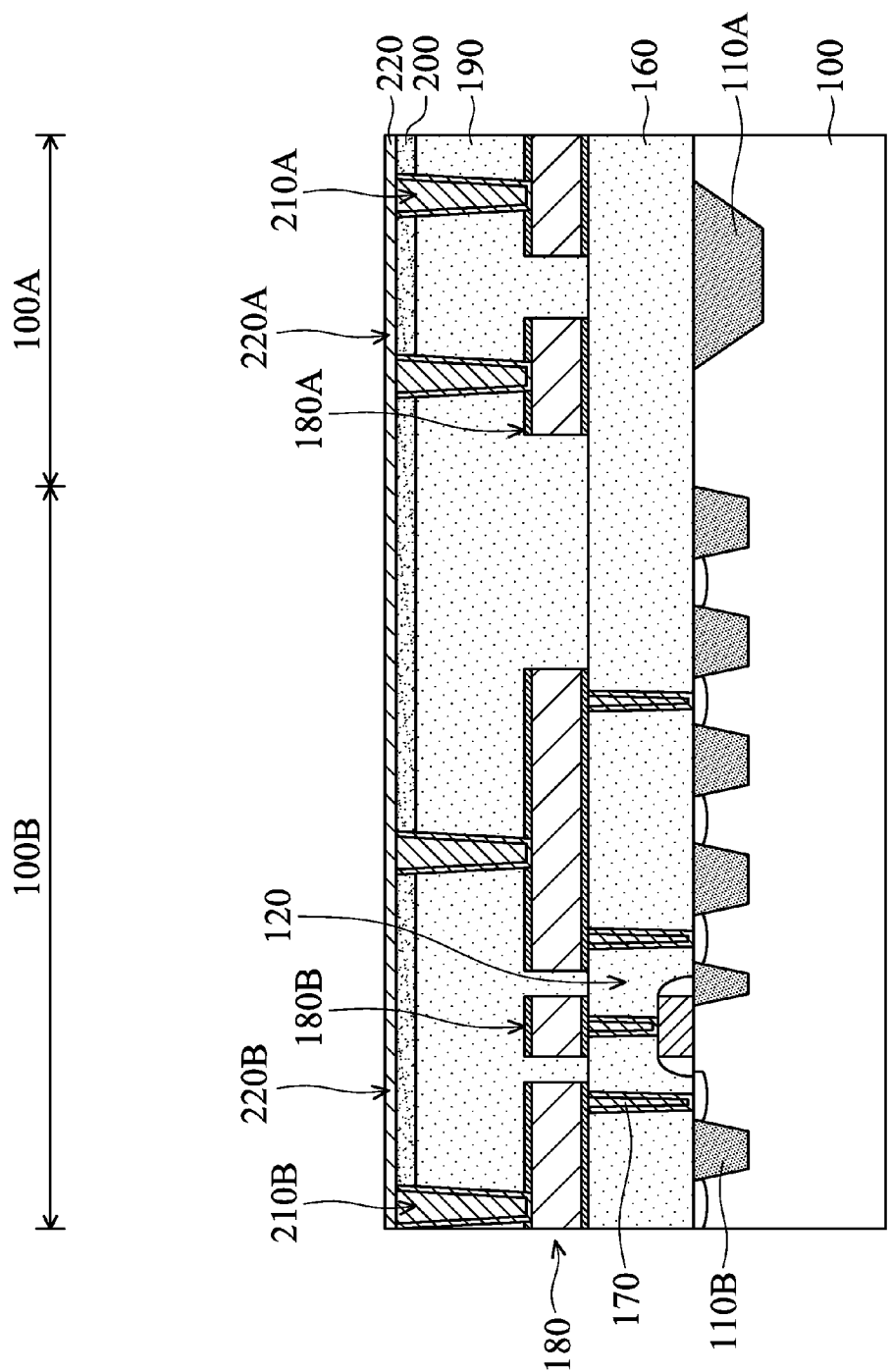

As shown in FIG. 1E, a resistor layer 220 is deposited over the buffer layer 200 in the resistor region 100A and the non-resistor region 100B, in accordance with some embodiments. In some embodiments, the resistor layer 220 has a portion 220A in the resistor region 100A and a portion 220B in the non-resistor region 100B. The portion 220A covers the conductive vias 210A, and vertically overlaps the portion 180A and the isolation feature 110A. The portion 220B covers the conductive vias 210B, and vertically overlaps the portion 180B and the isolation features 110B.

In some embodiments, the resistor layer 220 includes a thin-film-resistor (TFR) material, such as a metal resistor material. In some embodiments, the resistor layer 220 includes SiCr, TaN, NiCr, CrSiO, CrSiC, another suitable material, or a combination thereof. The material and/or thickness of the resistor layer 220 can be selected based on the desired resistor properties. In some embodiments, the resistor layer 220 is deposited using a PVD process (such as a sputtering process), a CVD process, an ALD process, another applicable process, or a combination thereof.

Figure 1F:
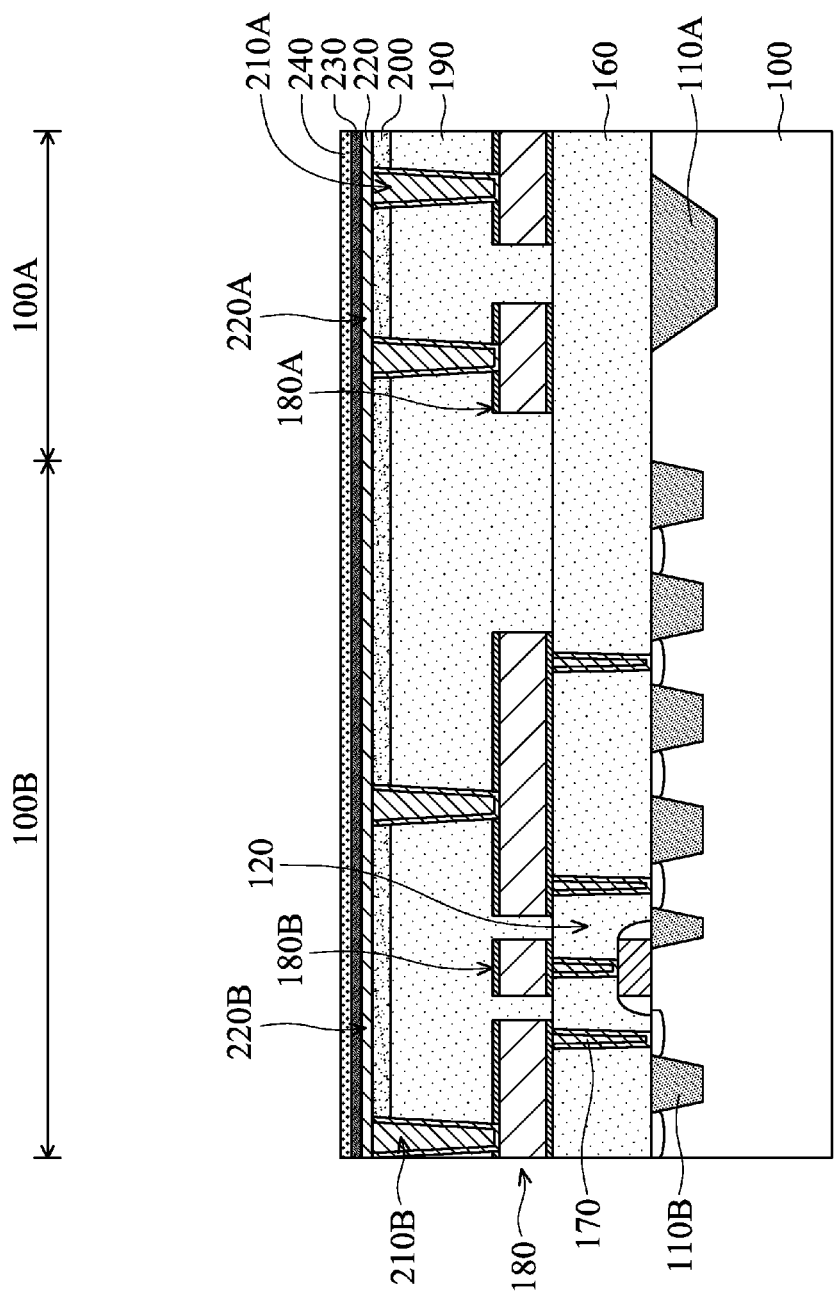

As shown in FIG. 1F, an anti-reflective layer 230 is deposited in the resistor region 100A and the non-resistor region 100B, in accordance with some embodiments. The anti-reflective layer 230 minimizes an unwanted spreading phenomena that can occur during subsequent photoresist exposure procedures. As a result, the ability to obtain sharper images of the photoresist used as the mask for the resistor definition is increased.

The anti-reflective layer 230 covers the resistor layer 220. In some embodiments, the anti-reflective layer 230 is in direct contact with the resistor layer 220. In some embodiments, the anti-reflective layer 230 includes multiple sub-layers.

In some embodiments, the anti-reflective layer 230 includes silicon oxynitride (SiON), silicon nitride, a bottom anti-reflective coating (BARC) material, another suitable material, or a combination thereof. In some embodiments, the anti-reflective layer 230 is deposited using a CVD process, a PECVD process, another applicable process, or a combination thereof.

Many variations and/or modifications can be made to embodiments of the disclosure. In some other embodiments, the anti-reflective layer 230 is not deposited over the resistor layer 220. The anti-reflective layer 230 may be omitted.

As shown in FIG. 1F, a protection layer 240 is deposited in the resistor region 100A and the non-resistor region 100B, in accordance with some embodiments. The protection layer 240 covers the anti-reflective layer 230 and the resistor layer 220. The protection layer 240 prevents the resistor layer 220 from oxidation and damage.

In some embodiments, the protection layer 240 is in direct contact with the anti-reflective layer 230. As mentioned above, in some other embodiments, the anti-reflective layer 230 is not deposited over the resistor layer 220. As a result, the protection layer 240 is in direct contact with the resistor layer 220.

In some embodiments, the protection layer 240 includes multiple sub-layers. In some embodiments, the protection layer 240 includes oxide (such as silicon oxide), nitride (such as silicon nitride), another suitable material, or a combination thereof. In some embodiments, the protection layer 240 is deposited using a CVD process, a PECVD process, another applicable process, or a combination thereof.

Many variations and/or modifications can be made to embodiments of the disclosure. In some other embodiments, the protection layer 240 is not deposited over the resistor layer 220. The protection layer 240 may be omitted. In some other embodiments, the protection layer 240 and the anti-reflective layer 230 are not deposited over the resistor layer 220. In these cases, a buffer layer (not shown) is deposited in the resistor region 100A to cover and protect the top and/or the sidewalls of the resistor feature 220'. The material and formation method of the buffer layer may be substantially the same as or similar to that of the buffer layer 200 with high quality and planarity.

Figure 1G:
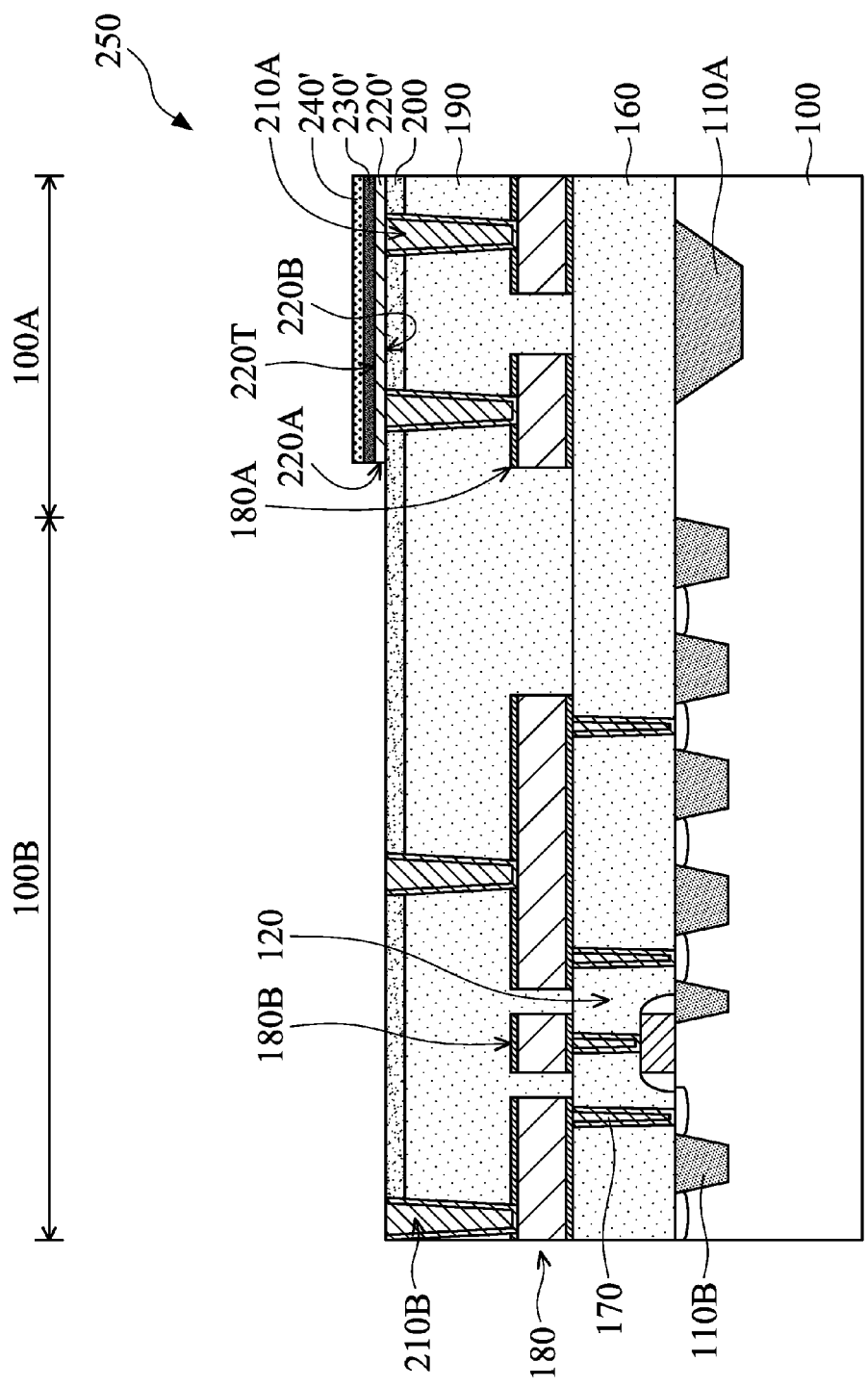

As shown in FIG. 1G, the resistor layer 220, the anti-reflective layer 230 and the protection layer 240 are patterned, in accordance with some embodiments. In some embodiments, portions of the resistor layer 220, the anti-reflective layer 230 and the protection layer 240 in the non-resistor region 100B are removed. As a result, a resistor feature 220', an anti-reflective feature 230' and a protection feature 240' are formed in the resistor region 100A. The resistor feature 220', the anti-reflective feature 230' and the protection feature 240' together form one or more resistor structures including a resistor structure 250 in the resistor region 100A. In some embodiments, the resistor structure 250 does not vertically overlap the device element 120. In some embodiments, no device element is directly under the resistor structure 250.

In some embodiments, the portion 220B of the resistor layer 220 in the non-resistor region 100B is removed. As a result, the portion 220A of the resistor layer 220 remains in the resistor region 100A and forms the resistor feature 220'. The resistor feature 220' is electrically connected to the portion 180A of the conductive layer 180 through the conductive vias 210A below the resistor feature 220'. In some embodiments, the resistor feature 220' vertically overlaps the portion 180A of the conductive layer 180 and the conductive vias 210A.

In some embodiments, the resistor feature 220' has a top surface 220T, which faces the anti-reflective feature 230', and a bottom surface 220B, which faces the buffer layer 200 and the conductive layer 180. In some embodiments, the top surface 220T of the resistor feature 220' is substantially entirely covered by the anti-reflective feature 230', as shown in FIG. 1G. As a result, the resistor feature 220' is not exposed from the anti-reflective feature 230'.

In some embodiments, the bottom surface 220B of the resistor feature 220' is separated from the dielectric layer 190 by the buffer layer 200. In some embodiments, the bottom surface 220B is in direct contact with the buffer layer 200 and the conductive vias 210A.

In some embodiments, the anti-reflective feature 230' is vertically sandwiched between the resistor feature 220' and the protection feature 240'. In some embodiments, the top surface 220T of the resistor feature 220' is substantially entirely covered by the protection feature 240', as shown in FIG. 1G. As a result, the resistor feature 220' is not exposed from the protection feature 240'.

In some embodiments, the resistor feature 220', the anti-reflective feature 230' and the protection feature 240' have a substantial area as viewed from a top view. The area is taken along a plane parallel to the main surface of the semiconductor device structure. The main surface of the semiconductor device structure may be an active surface of the semiconductor device structure.

In some embodiments, the resistor layer 220, the anti-reflective layer 230 and the protection layer 240 are patterned using photolithography and etching processes, other applicable processes, or a combination thereof. In some embodiments, the etching process includes a dry etching process, a wet etching process, another suitable etching process, or a combination thereof.

In some embodiments, a photo mask is used in the photolithography process to define the pattern of the resistor feature 220', the anti-reflective feature 230' and the protection feature 240'. In some embodiments, only one photo mask is used during the patterning of the resistor layer 220, the anti-reflective layer 230 and the protection layer 240. However, embodiments of the disclosure are not limited thereto.

As shown in FIG. 2, there are multiple resistor structures 250 in the resistor region 100A, in accordance with some embodiments. In some embodiments, the resistor structures 250 are arranged in an array. In some embodiments, resistor structure 250 includes a portion 250A and portions 250B on opposite sides of the portion 250A. The portion 250A defines a resistor region of the resistor structure 250. In some embodiments, the portion 250A is straight. As a result, electromigration, which may be induced due to a curved resistor, is prevented.

In some embodiments, the portion 250A of the resistor structure 250 does not vertically overlap the conductive features of the interconnection structure. The conductive features may include conductive contacts, conductive lines and/or conductive vias. For example, the portion 250A does not vertically overlap the portion 180A of the conductive layer 180 and the conductive vias 210A. As a result, it can be ensured that heat, which is generated by the conductive layer 180 and the conductive vias 210A, is not transferred to the portion 250A. Accordingly, the lifetime of the resistor structure 250 is improved.

The portions 250B define landing pad regions of the resistor structure 250. In some embodiments, the portions 250B vertically overlap the portion 180A of the conductive layer 180 and the conductive vias 210A. In some embodiments, one or more arrays of the conductive vias 210A are coupled to each of the portions 250B. In some embodiments, contact resistance, which is generated between the conductive vias 210A and the bottom surface 220B of resistor feature 220', is eliminated through multiple conductive vias 210A. As a result, the performance of the resistor feature 220' is not affected due to the contact resistance.

Figure 3:
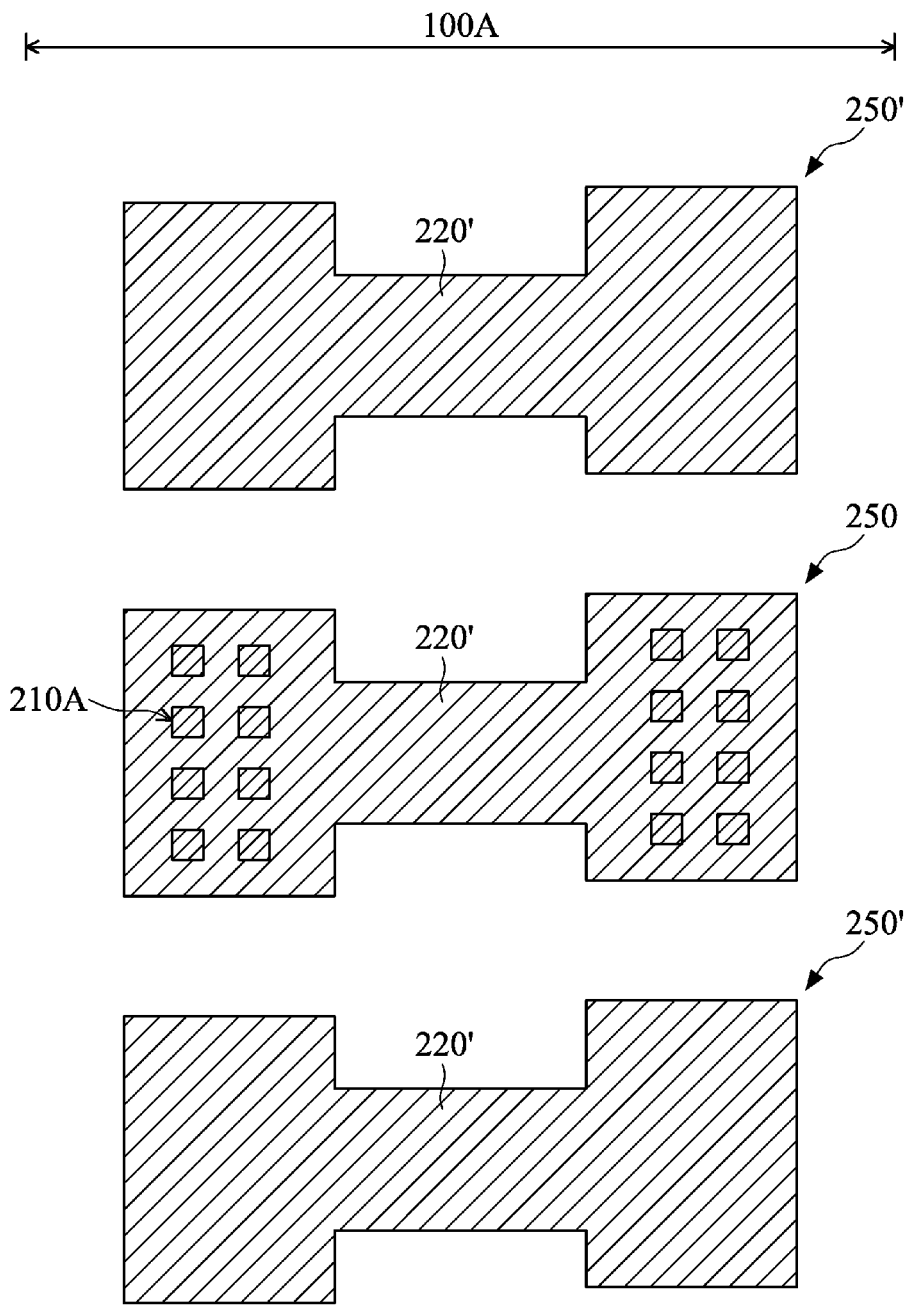
FIG. 3 is a top view of one stage of a process for forming a semiconductor device structure, in accordance with some embodiments.

Many variations and/or modifications can be made to embodiments of the disclosure. FIG. 3 is a top view of one stage of a process for forming a semiconductor device structure, in accordance with some embodiments. As shown in FIG. 3, there are multiple dummy resistor structures 250' in the resistor region 100A, in accordance with some embodiments. In some embodiments, the dummy resistor structures 250' are adjacent to the resistor structures 250. In some embodiments, the resistor structures 250 and the dummy resistor structures 250' are arranged in an array. In some embodiments, the resistor structures 250 and the dummy resistor structures 250' are positioned at substantially the same level.

In some embodiments, the dummy resistor structures 250' do not vertically overlap the conductive features of the interconnection structure. The conductive features may include conductive contacts, conductive lines and/or conductive vias. For example, the dummy resistor structures 250' do not vertically overlap the portion 180A of the conductive layer 180 and the conductive vias 210A.

The structure and material of the dummy resistor structures 250' may be substantially the same as or similar to that of the resistor structures 250. For example, the dummy resistor structures 250' include the resistor feature 220', the anti-reflective feature 230' and the protection feature 240'. The resistor feature 220' of the dummy resistor structures 250' is also referred to as a dummy resistor feature. The dummy resistor feature is formed of the portion 220A of the resistor layer 220.

In some embodiments, the resistor layer 220, the anti-reflective layer 230 and the protection layer 240 are patterned to form the resistor structures 250 and the dummy resistor structures 250'. Due to the dummy resistor structures 250', a loading effect during the patterning of the resistor layer 220, the anti-reflective layer 230 and the protection layer 240 is mitigated or eliminated.

Figure 1H:
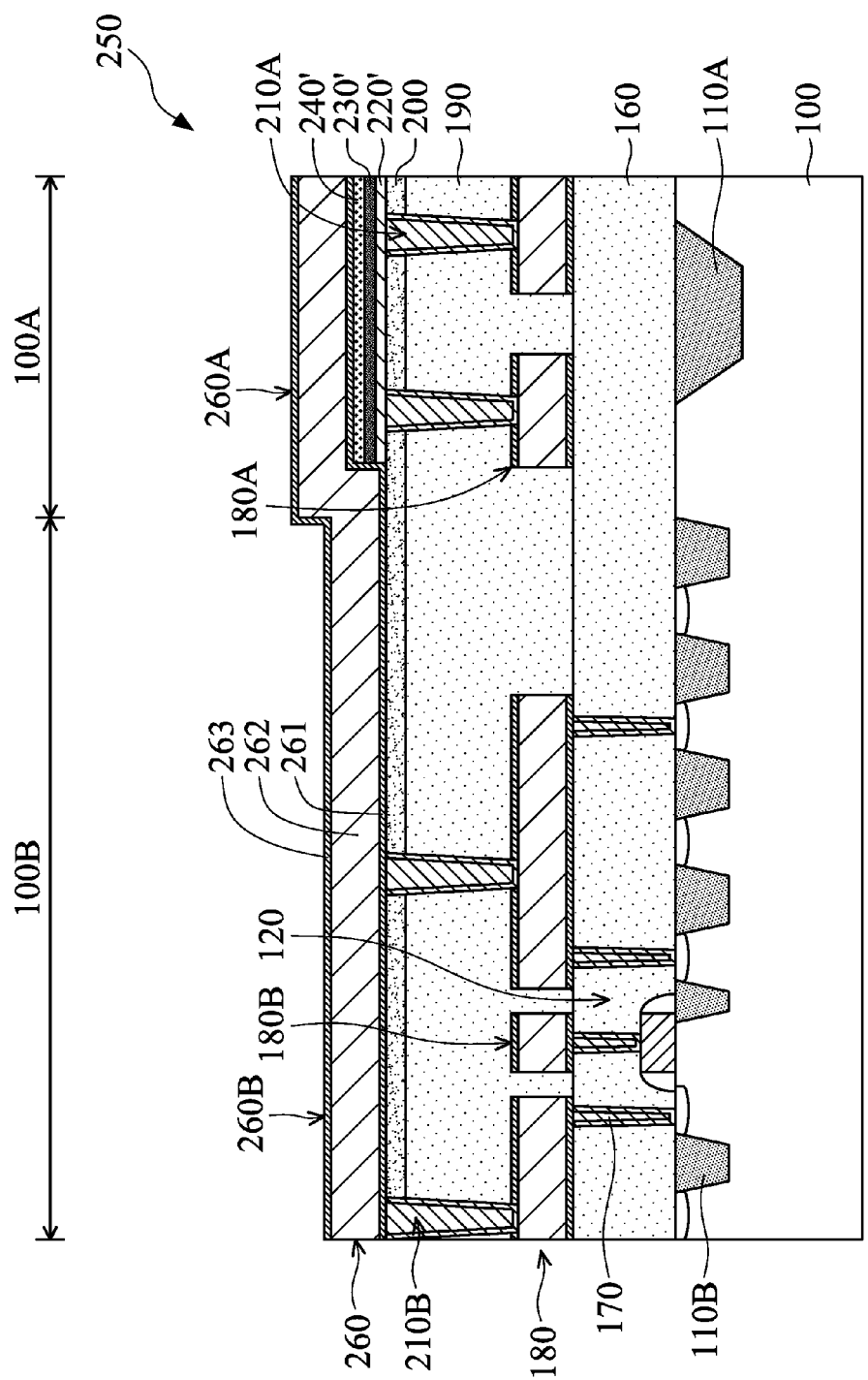

As shown in FIG. 1H, a conductive layer 260 is deposited over the buffer layer 200 in the resistor region 100A and the non-resistor region 100B, in accordance with some embodiments. In some embodiments, the conductive layer 260 includes multiple sub-layers. For example, the conductive layer 260 has a first sub-layer 261, a second sub-layer 262 and a third sub-layer 263, as shown in FIG. 1H. The second sub-layer 262 is thicker than the first sub-layer 261 and the third sub-layer 263.

In some embodiments, the first sub-layer 261 is made of titanium nitride, another suitable material, or a combination thereof. In some embodiments, the second sub-layer 262 is made of aluminum, copper, tungsten, titanium, nickel, gold, platinum, silver, another suitable material, or a combination thereof. In some embodiments, the third sub-layer 263 is made of titanium nitride, another suitable material, or a combination thereof. In some embodiments, the first sub-layer 261, the second sub-layer 262 or the third sub-layer 263 is deposited using an a PVD process, a CVD process, an electroplating process, an electroless plating process, another applicable process, or a combination thereof.

As shown in FIG. 1H, the conductive layer 260 has a portion 260A in the resistor region 100A and a portion 260B in the non-resistor region 100B, in accordance with some embodiments. In some embodiments, the portion 260A of the conductive layer 260 covers the resistor feature 220', the anti-reflective feature 230' and the protection feature 240'. In some embodiments, the portion 260A vertically overlaps the portion 180A of the conductive layer 180 and the conductive vias 210A. In some embodiments, the portion 260B of the conductive layer 260 covers the conductive vias 210B. In some embodiments, the portion 260B vertically overlaps the portion 180B of the conductive layer 180 and the conductive vias 210B.

Figure 1I:
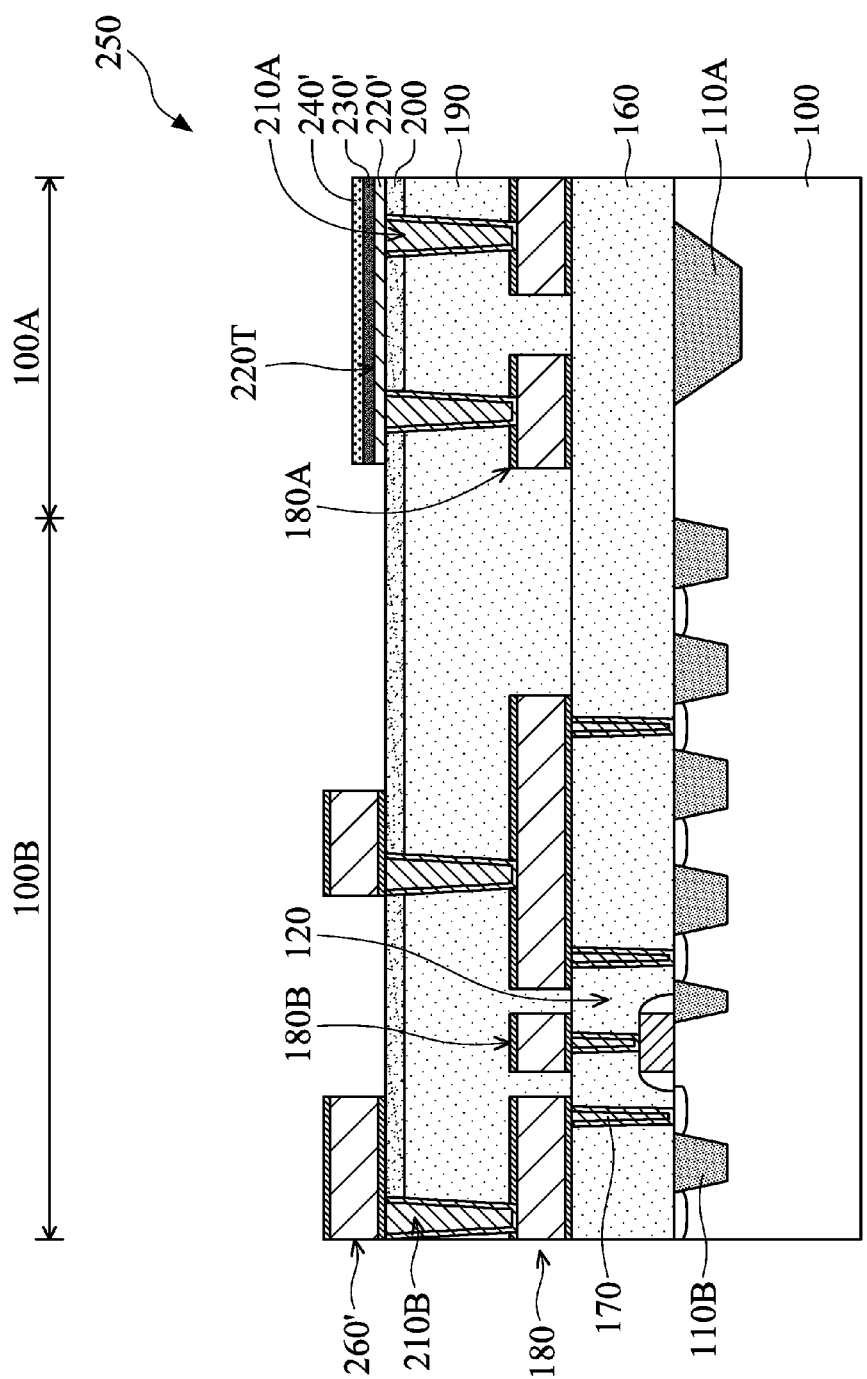

As shown in FIG. 1I, the conductive layer 260 is patterned, in accordance with some embodiments. In some embodiments, the portion 260A of the conductive layer 260 in the resistor region 100A is removed. As a result, the protection feature 240' and the buffer layer 200 in the resistor region 100A are exposed. In some embodiments, the portion 260A in the resistor region 100A is completely removed.

In some embodiments, the portion 260B of the conductive layer 260 in the non-resistor region 100B is partially removed. As a result, the portion 260B remaining in the non-resistor region 100B forms a patterned conductive layer 260'. In some embodiments, an annealing process is subsequently performed over the conductive layer 260' and the resistor feature 220'. For example, a rapid thermal annealing process is performed.

In some embodiments, the top surface 220T of the resistor feature 220' maintains substantially entirely covered by the anti-reflective feature 230' and/or the protection feature 240' during the formation of the conductive layer 260'. As a result, the resistor feature 220' is protected by the anti-reflective feature 230' and/or the protection layer and is not exposed during the formation of the conductive layer 260'. In some embodiments, the area of the anti-reflective feature 230' and/or the protection feature 240' are constant before the formation of the conductive layer 260'.

In some embodiments, the conductive layer 260' is electrically connected to the portion 180B of the conductive layer 180 through the conductive vias 210B. In some embodiments, the conductive layer 260' and the resistor feature 220' are positioned side by side over the buffer layer 200. In some embodiments, the conductive layer 260' and the resistor feature 220' are positioned at substantially the same level which is over the conductive vias 210A and 210B. In some embodiments, the resistor structure 250 does not vertically overlap the conductive layer 260'. In some embodiments, the resistor structure 250 is physically separated from the conductive layer 260'.

In some embodiments, the conductive layer 180 is closer to the resistor feature 220' than the conductive layer 260'. In some embodiments, the conductive layer 260' is thicker than the resistor feature 220', the anti-reflective feature 230' and the protection feature 240'.

Figure 1J:
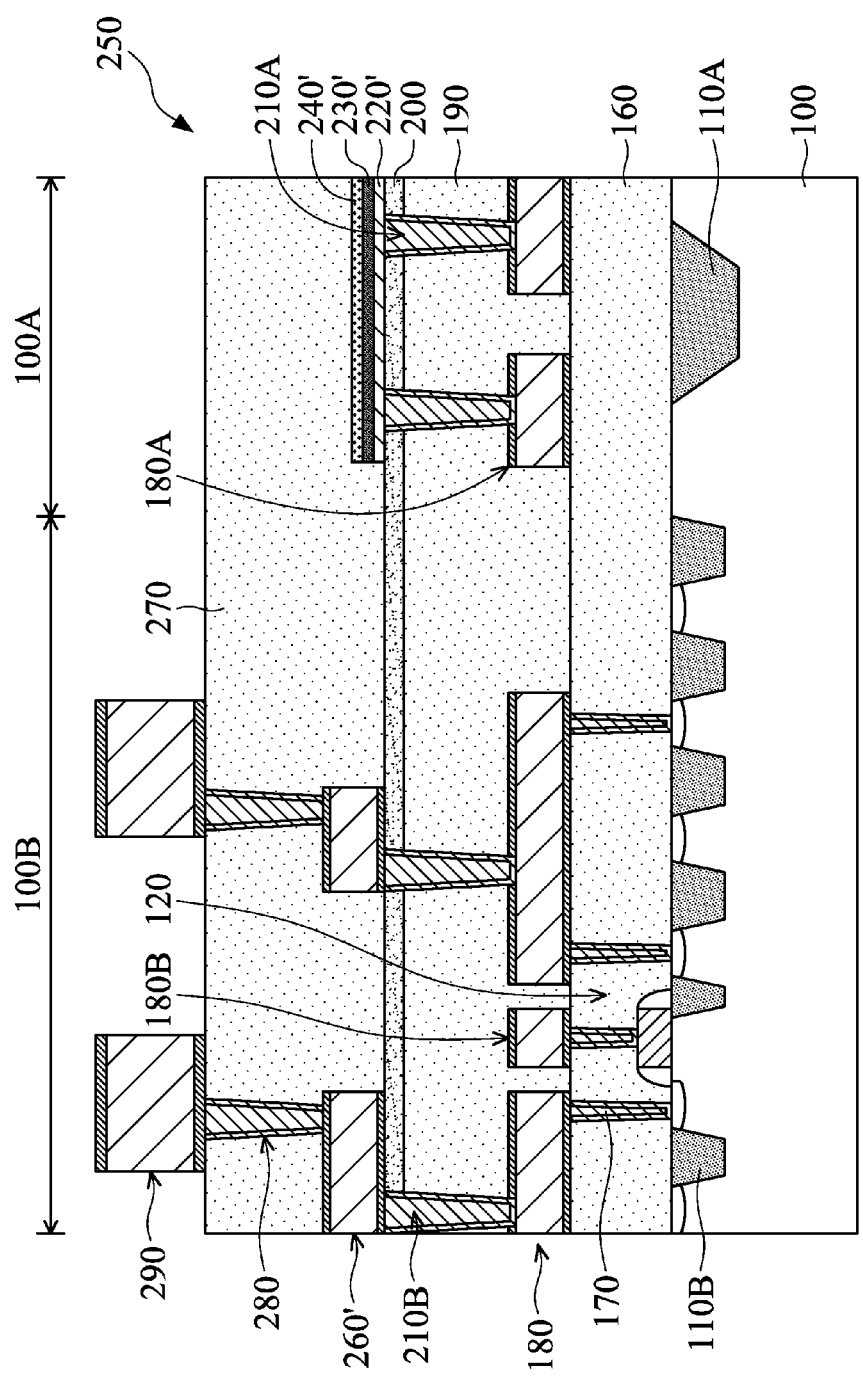

As shown in FIG. 1J, a dielectric layer 270 is deposited over the buffer layer 200 in the resistor region 100A and the non-resistor region 100B, in accordance with some embodiments. The dielectric layer 270 covers the conductive layer 260' and the resistor structure 250. The dielectric layer 270 may serve as an IMD layer of an interconnection structure.

The material and formation method of the dielectric layer 270 may be substantially the same as or similar to that of the dielectric layer 190. In some embodiments, the area of the anti-reflective feature 230' and/or the protection feature 240' are constant before the formation of the dielectric layer 270.

As shown in FIG. 1J, conductive vias 280 are formed in the dielectric layer 270 in the non-resistor region 100B, in accordance with some embodiments. The conductive vias 280 are electrically connected to the conductive layer 260'. The material and formation method of the conductive vias 280 may be substantially the same as or similar to that of the conductive vias 210A and 210B.

In some embodiments, there is no conductive via 280 in the resistor region 100A. The conductive vias 280 do not overlap the resistor feature 220', the anti-reflective feature 230' and the protection feature 240'. In some embodiments, the portion 250A of the resistor structure 250 does not vertically overlap the conductive vias 280.

As shown in FIG. 1J, a patterned conductive layer 290 is formed over the dielectric layer 270 in the non-resistor region 100B, in accordance with some embodiments. The conductive layer 290 is electrically connected to the conductive layer 260' through the conductive vias 280.

In some embodiments, the conductive layer 290 is not positioned in the resistor region 100A. The conductive layer 290 does not vertically and laterally overlap the resistor feature 220', the anti-reflective feature 230' and the protection feature 240'. In some embodiments, the portion 250A of the resistor structure 250 does not vertically overlap the conductive layer 290. As a result, it can be ensured that heat, which is generated by the conductive layer 290, is not transferred to the resistor feature 220'. Accordingly, the lifetime of the resistor structure 250 is improved.

Afterwards, one or more dielectric layers and conductive features are formed over the dielectric layer 270 and the conductive layer 290 to continue the formation of the interconnection structure. Various device elements are interconnected through the interconnection structure to form integrated circuit devices. For example, the integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

Although FIG. 1J shows that the conductive layer 260' and the resistor feature 220' are positioned at substantially the same level, embodiments of the disclosure are not limited thereto. The resistor feature 220' and any suitable conductive layer of the interconnection structure may be positioned at substantially the same level. In some other embodiments, the resistor feature 220' and the conductive layer 180 are positioned at substantially the same level. As a result, the resistor feature 220' is closer to the semiconductor substrate 100 than the conductive layer 260'. Accordingly, the heat dissipation of the resistor feature 220' is enhanced.

Many variations and/or modifications can be made to embodiments of the disclosure. In some other embodiments, one or more of the conductive features in the interconnection structure (such as the conductive layers 180, 260' and 290, the conductive contacts 170 and the conductive vias 210A, 210B and 280) are formed using a single or dual damascene process.

For example, after the formation of the resistor structure 250, the dielectric layer 270 is deposited over the buffer layer 200 in the resistor region 100A and the non-resistor region 100B. Afterwards, openings (or trenches) are formed in the dielectric layer 270 and expose the conductive vias 280. A conductive material is then deposited over the dielectric layer 270 and fills the openings of the dielectric layer 270. Subsequently, the conductive material over the dielectric layer 270 is removed. The remaining portions of the conductive material in the openings of the dielectric layer 270 form the conductive layer 290 in the non-resistor region 100B.

In some cases, a resistor layer, an etch stop layer and a protection layer are patterned to a resistor feature, an etching stop feature and a protection feature. Afterwards, the etching stop feature and the protection feature over the resistor feature are further patterned to expose a portion of the resistor feature so that a TFR is formed. Conductive vias and a conductive layer are sequentially formed over the TFR to electrically connect to the underlying TFR. There are two or more masks for the resistor definition.

In accordance with some embodiments, the resistor layer 220, the anti-reflective layer 230 and the protection layer 240 are patterned to the resistor feature 220', the anti-reflective feature 230' and the protection feature 240'. As a result, the resistor structure 250 is formed in the resistor region 100A. The conductive layer 180 and the conductive vias 210A have been previously formed under the resistor structure 250. Afterwards, the conductive layer 260' is over the conductive layer 180 in the non-resistor region 100B.

In some embodiments, the anti-reflective feature 230' and the protection feature 240' maintain substantially the same size without being patterned before the formation of the conductive layer 260'. As a result, the resistor feature 220' is prevented from damage, which may be a result of the patterning of the anti-reflective feature 230' and the protection feature 240'. Therefore, device performance and the reliability of the semiconductor device structure is significantly enhanced. For example, the resistor structure 250 in the semiconductor device structure exhibits high precision and stability, including low thermal coefficient of resistance (TCR) and low voltage coefficient of resistance (VCR).

Furthermore, since the anti-reflective feature 230' and the protection feature 240' are not patterned, the number of the mask required for the resistor definition is reduced. In some embodiments, there is one mask required for the resistor definition, but embodiments of the disclosure are not limited thereto. As a result, the fabrication process of the resistor structure 250 becomes simpler. Accordingly, the fabrication cost and the time required for forming the resistor structure 250 are greatly reduced.

In accordance with some embodiments, the resistor structure 250 and the conductive layer 260' are positioned at substantially the same level. As a result, the conductive vias 210A and 210B have a substantial same thickness or height. Accordingly, it becomes easier to form the conductive vias 210A and 210B. For example, it can be ensured that the thickness or height of the conductive vias 210A and 210B is accurately controlled. Therefore, the reliability of the semiconductor device structure is improved.

In some embodiments, the formation method shown in FIGS. 1A-1J is used to form a resistor structure in an interconnection structure of a semiconductor device structure. Embodiments of the disclosure are not limited. In some other embodiments, the formation method described in the disclosure can be used to form a resistor structure in any suitable structure of a semiconductor device structure.

Many variations and/or modifications can be made to embodiments of the disclosure. In some other embodiments, embodiments of the disclosure include forming a semiconductor device structure with a resistor structure and a single or dual damascene structure in an interconnection structure.

Embodiments of the disclosure can be applied to not only a semiconductor device structure with a planar FET and a resistor structure but also a semiconductor device structure with a FinFET and a resistor structure. In some embodiments, the materials and/or formation methods of a semiconductor device structure with a FinFET and a resistor structure are similar to those of the described semiconductor device structure with a planar FET and a resistor structure.

Embodiments of the disclosure are not limited and may be applied to fabrication processes for any suitable technology generation. Various technology generations include a 20 nanometer (nm) node, a 16 nm node, a 10 nm node, or another suitable node.

Embodiments of the disclosure form a semiconductor device structure with a resistor structure. A resistor layer, an anti-reflective layer and a protection layer are sequentially deposited over a first conductive layer and conductive vias. The resistor layer, the anti-reflective layer and the protection layer are patterned to a resistor feature, an anti-reflective feature and a protection feature so that the resistor structure is formed. The resistor structure is electrically connected to the underlying first conductive layer through the underlying conductive vias. The anti-reflective feature and the protection feature maintain substantially the same size without being patterned. As a result, the resistor feature is protected from damage. Furthermore, the fabrication process of the resistor structure becomes simpler. Accordingly, the fabrication cost and the time required for forming the resistor structure are significantly reduced.

In accordance with some embodiments, a method for forming a semiconductor device structure is provided. The method includes forming a first patterned conductive layer over a semiconductor substrate. The method also includes forming a dielectric layer covering the first patterned conductive layer. The method further includes forming a conductive via in the dielectric layer. The conductive via is electrically connected to the first patterned conductive layer. In addition, the method includes forming a resistor layer over the dielectric layer and forming a protection layer over the resistor layer. The method also includes patterning the protection layer to form a protection feature and patterning the resistor layer to form a resistor feature overlapping the first patterned conductive layer. The resistor feature is electrically connected to the first patterned conductive layer through the conductive via. The resistor feature has a top surface that is covered by the protection feature. The method further includes forming a second patterned conductive layer over the dielectric layer. The top surface maintains covered by the protection feature during the formation of the second patterned conductive layer.

In accordance with some embodiments, a method for forming a semiconductor device structure is provided. The method includes providing a semiconductor substrate. The semiconductor substrate includes a resistor region and a non-resistor region. The method also includes forming a first patterned conductive layer over the semiconductor substrate in the resistor region and the non-resistor region. The method further includes forming a dielectric layer covering the first patterned conductive layer. In addition, the method includes forming a first conductive via and a second conductive via in the dielectric layer in the resistor region and the non-resistor region, respectively. The method also includes forming a resistor layer over the dielectric layer. The resistor layer includes a first portion in the resistor region and a second portion in the non-resistor region. The method further includes removing the second portion so that the first portion forms a resistor feature. The resistor feature is electrically connected to the first patterned conductive layer through the first conductive via. The method further includes forming a second patterned conductive layer over the dielectric layer in the non-resistor region. The second patterned conductive layer is electrically connected to the first patterned conductive layer through the second conductive via.

In accordance with some embodiments, a semiconductor device structure is provided. The semiconductor device structure includes a semiconductor substrate. The semiconductor substrate includes a resistor region and a non-resistor region. The semiconductor device structure also includes a first patterned conductive layer over the semiconductor substrate in the resistor region and the non-resistor region. The semiconductor device structure further includes a dielectric layer covering the first patterned conductive layer. In addition, the semiconductor device structure includes a first conductive via in the dielectric layer in the resistor region and a second conductive via in the dielectric layer in the non-resistor region. The semiconductor device structure also includes a resistor feature over the dielectric layer in the resistor region. The resistor feature overlaps the first patterned conductive layer and is electrically connected to the first patterned conductive layer through the first conductive via. The semiconductor device structure further includes a second patterned conductive layer covering the dielectric layer in the non-resistor region. The second patterned conductive layer is electrically connected to the first patterned conductive layer through the second conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first patterned conductive layer over a semiconductor substrate;
    forming a dielectric layer covering the first patterned conductive layer;
    forming a conductive via in the dielectric layer, wherein the conductive via is electrically connected to the first patterned conductive layer;
    forming a resistor layer over the dielectric layer;
    forming a protection layer over the resistor layer;
    patterning the protection layer to form a protection feature;
    patterning the resistor layer to form a resistor feature overlapping the first patterned conductive layer, wherein the resistor feature is electrically connected to the first patterned conductive layer through the conductive via, and the resistor feature has a top surface that is covered by the protection feature; and
    forming a second patterned conductive layer over the dielectric layer, wherein the top surface maintains covered by the protection feature during the formation of the second patterned conductive layer, and wherein the second patterned conductive layer and the resistor feature are formed to be at a substantially same level.

2. The method for forming a semiconductor device structure as claimed in claim 1, wherein the formation of the second patterned conductive layer comprises:
    forming a conductive layer over the dielectric layer, wherein the conductive layer comprises a portion overlapping the resistor feature and the conductive via; and
    removing the portion of the conductive layer to form the second patterned conductive layer.

3. The method for forming a semiconductor device structure as claimed in claim 1, further comprising:
    forming an anti-reflective layer over the resistor layer before the formation of the protection layer; and
    patterning the anti-reflective layer to form an anti-reflective feature, wherein the anti-reflective feature is between the resistor feature and the protection feature.

4. The method for forming a semiconductor device structure as claimed in claim 3, wherein the anti-reflective feature does not expose the top surface of the resistor feature before the formation of the second patterned conductive layer.

5. The method for forming a semiconductor device structure as claimed in claim 1, further comprising:

forming a buffer layer covering the dielectric layer, wherein the conductive via penetrates the buffer layer before the formation of the resistor layer.

6. The method for forming a semiconductor device structure as claimed in claim 1, wherein the method does not comprise patterning the protection feature after the formation of the resistor feature and before the formation of the second patterned conductive layer.

7. A method for forming a semiconductor device structure, comprising:
- providing a semiconductor substrate, wherein the semiconductor substrate comprises a resistor region and a non-resistor region;
- forming a first patterned conductive layer over the semiconductor substrate in the resistor region and the non-resistor region;
- forming a dielectric layer covering the first patterned conductive layer;
- forming a first conductive via and a second conductive via in the dielectric layer in the resistor region and the non-resistor region, respectively;
- forming a resistor layer over the dielectric layer, wherein the resistor layer comprises a first portion in the resistor region and a second portion in the non-resistor region;
- removing the second portion so that the first portion forms a resistor feature, wherein the resistor feature is electrically connected to the first patterned conductive layer through the first conductive via; and
- forming a second patterned conductive layer over the dielectric layer in the non-resistor region, wherein the second patterned conductive layer is electrically connected to the first patterned conductive layer through the second conductive via.

8. The method for forming a semiconductor device structure as claimed in claim 7, wherein the second patterned conductive layer and the resistor layer are formed at a substantially same level.

9. The method for forming a semiconductor device structure as claimed in claim 7, further comprising:
- forming a protection feature over the resistor feature before the formation of the second patterned conductive layer, wherein the protection feature comprises an area that is constant after the formation of the resistor feature and before the formation of the second patterned conductive layer.

10. The method for forming a semiconductor device structure as claimed in claim 9, wherein the area of the protection feature is substantially equal to that of the resistor feature after the formation of the second patterned conductive layer.

11. The method for forming a semiconductor device structure as claimed in claim 7, further comprising:
- forming a buffer layer covering the dielectric layer before the formation of the resistor layer, wherein the first conductive via penetrates the buffer layer to connect to the resistor feature, and the second conductive via penetrates the buffer layer to connect to the second patterned conductive layer.

12. The method for forming a semiconductor device structure as claimed in claim 7, wherein the first conductive via and the second conductive via are at a substantially same level that is below the resistor feature.

13. The method for forming a semiconductor device structure as claimed in claim 7, wherein the first portion of the resistor layer further forms a dummy resistor feature in the resistor region, and wherein the dummy resistor feature does not overlap the first conductive via.

14. A semiconductor device structure, comprising:
- a semiconductor substrate, wherein the semiconductor substrate comprises a resistor region and a non-resistor region;
- a first patterned conductive layer over the semiconductor substrate in the resistor region and the non-resistor region;
- a dielectric layer covering the first patterned conductive layer;
- a first conductive via in the dielectric layer in the resistor region;
- a second conductive via in the dielectric layer in the non-resistor region;
- a resistor feature over the dielectric layer in the resistor region, wherein the resistor feature overlaps the first patterned conductive layer and is electrically connected to the first patterned conductive layer through the first conductive via; and
- a second patterned conductive layer covering the dielectric layer in the non-resistor region, wherein the second patterned conductive layer is electrically connected to the first patterned conductive layer through the second conductive via, and wherein the second patterned conductive layer and the resistor feature laterally overlap over the dielectric layer.

15. The semiconductor device structure as claimed in claim 14, wherein the resistor feature comprises SiCr, TaN, NiCr, CrSiO, CrSiC or a combination thereof.

16. The semiconductor device structure as claimed in claim 14, wherein the second patterned conductive layer and the resistor feature are at a substantially same level.

17. The semiconductor device structure as claimed in claim 14, wherein the first patterned conductive layer is closer to the resistor feature than the second patterned conductive layer.

18. The semiconductor device structure as claimed in claim 14, wherein the first conductive via and the second conductive via are at a substantially same level that is below the resistor feature.

19. The semiconductor device structure as claimed in claim 14, further comprising:
- an anti-reflective feature over the resistor feature in the resistor region; and
- a protection feature over the anti-reflective feature in the resistor region, wherein the anti-reflective feature, the protection feature and the resistor feature have a substantial same area.

20. The semiconductor device structure as claimed in claim 14, further comprising:
- a dummy resistor feature, wherein the dummy resistor feature and the resistor feature are at a substantially same level.

* * * * *